US012672408B2

(12) United States Patent
Qin et al.

(10) Patent No.: US 12,672,408 B2
(45) Date of Patent: Jun. 30, 2026

(54) LED DISPLAY UNIT GROUP, MANUFACTURING METHOD OF LED DISPLAY UNIT GROUP, AND DISPLAY PANEL

(71) Applicant: FOSHAN NATIONSTAR OPTOELECTRONICS CO., LTD., Foshan (CN)

(72) Inventors: Kuai Qin, Foshan (CN); Shaojia Xie, Foshan (CN); Bin Cai, Foshan (GD); Fangping He, Foshan (CN); Zhuang Peng, Foshan (CN); Caineng Huo, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 498 days.

(21) Appl. No.: 18/215,980

(22) Filed: Jun. 29, 2023

(65) Prior Publication Data

US 2024/0006572 A1     Jan. 4, 2024

(30) Foreign Application Priority Data

Jun. 30, 2022     (CN) ......................... 202210772462.X

(51) Int. Cl.
H10H 20/857 (2025.01)
G09F 9/33 (2006.01)
(Continued)

(52) U.S. Cl.
CPC .......... H10H 20/857 (2025.01); H10W 90/00 (2026.01); H10H 20/0364 (2025.01)

(58) Field of Classification Search
CPC ........ H05K 2201/09936; H05K 1/0266; H01L 23/544; H01L 25/0753; H10W 46/00
See application file for complete search history.

(56) References Cited

U.S. PATENT DOCUMENTS

| | | | |
|---|---|---|---|
| 2020/0083420 A1* | 3/2020 | Gu ...................... | H01L 23/5384 |
| 2020/0381660 A1* | 12/2020 | Lee ...................... | H10K 59/122 |
| 2021/0343683 A1* | 11/2021 | Pfeuffer .............. | H01L 25/0753 |

FOREIGN PATENT DOCUMENTS

| | | |
|---|---|---|
| CN | 108012405 A | 5/2018 |
| CN | 109147584 A | 1/2019 |

(Continued)

OTHER PUBLICATIONS

First Examination Opinion Notification for Chinese Application No. 202210772462.X, dated Oct. 15, 2025 (Oct. 15, 2025)—8 pages (English Translation—8 pages).

*Primary Examiner* — Antonio B Crite
(74) *Attorney, Agent, or Firm* — CM Law; Stephen J. Weed

(57) ABSTRACT

A LED display unit group includes a substrate and an electronic device, where the substrate includes a pad layer and an ink layer, the substrate is provided with an identification structure, the pad layer is disposed on a first surface of a side of the substrate adjacent to the electronic device; the pad layer includes pad regions and a non-pad region, each of the pad regions includes multiple pads, and the non-pad region includes metal traces; and the ink layer is disposed above the pad layer; each of the multiple pads is configured to secure the electronic device and is electrically connected to the electronic device; the metal traces are configured to connect the multiple pads via the metal traces; and an orthographic projection of the identification structure on the substrate is partially overlapped or staggered with an orthographic projection of the pad regions on the substrate.

9 Claims, 6 Drawing Sheets

(51) Int. Cl.
    *H05K 1/02*      (2006.01)
    *H10H 20/01*    (2025.01)
    *H10W 46/00*   (2026.01)
    *H10W 70/05*   (2026.01)
    *H10W 90/00*   (2026.01)

(56)             References Cited

FOREIGN PATENT DOCUMENTS

| | | | |
|---|---|---|---|
| CN | 209372906 | U | 9/2019 |
| JP | H0556444 | U | 7/1993 |
| JP | 2004071846 | A | 3/2004 |
| JP | 2005283830 | A | 10/2005 |
| JP | 2011119660 | A | 6/2011 |

* cited by examiner

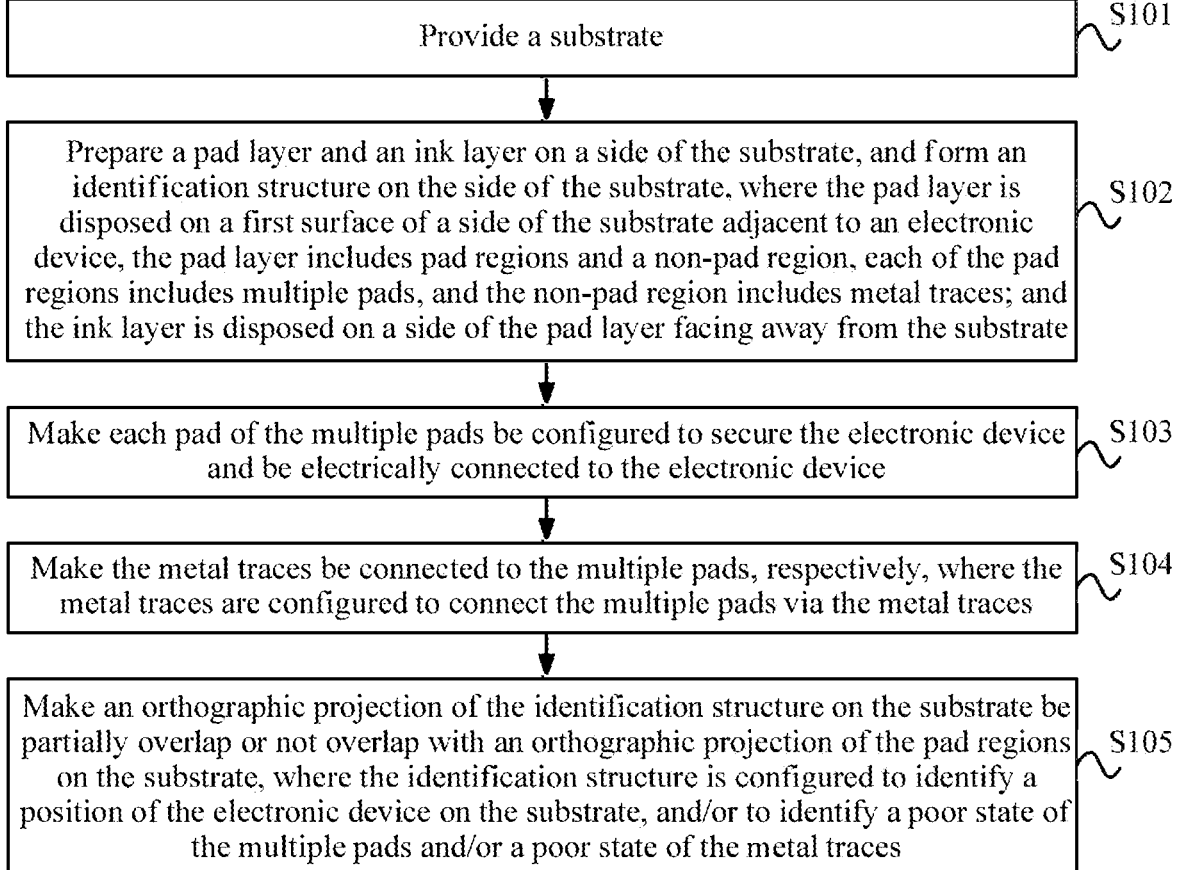

| Provide a substrate | S101 |

| Prepare a pad layer and an ink layer on a side of the substrate, and form an identification structure on the side of the substrate, where the pad layer is disposed on a first surface of a side of the substrate adjacent to an electronic device, the pad layer includes pad regions and a non-pad region, each of the pad regions includes multiple pads, and the non-pad region includes metal traces; and the ink layer is disposed on a side of the pad layer facing away from the substrate | S102 |

| Make each pad of the multiple pads be configured to secure the electronic device and be electrically connected to the electronic device | S103 |

| Make the metal traces be connected to the multiple pads, respectively, where the metal traces are configured to connect the multiple pads via the metal traces | S104 |

| Make an orthographic projection of the identification structure on the substrate be partially overlap or not overlap with an orthographic projection of the pad regions on the substrate, where the identification structure is configured to identify a position of the electronic device on the substrate, and/or to identify a poor state of the multiple pads and/or a poor state of the metal traces | S105 |

FIG. 5

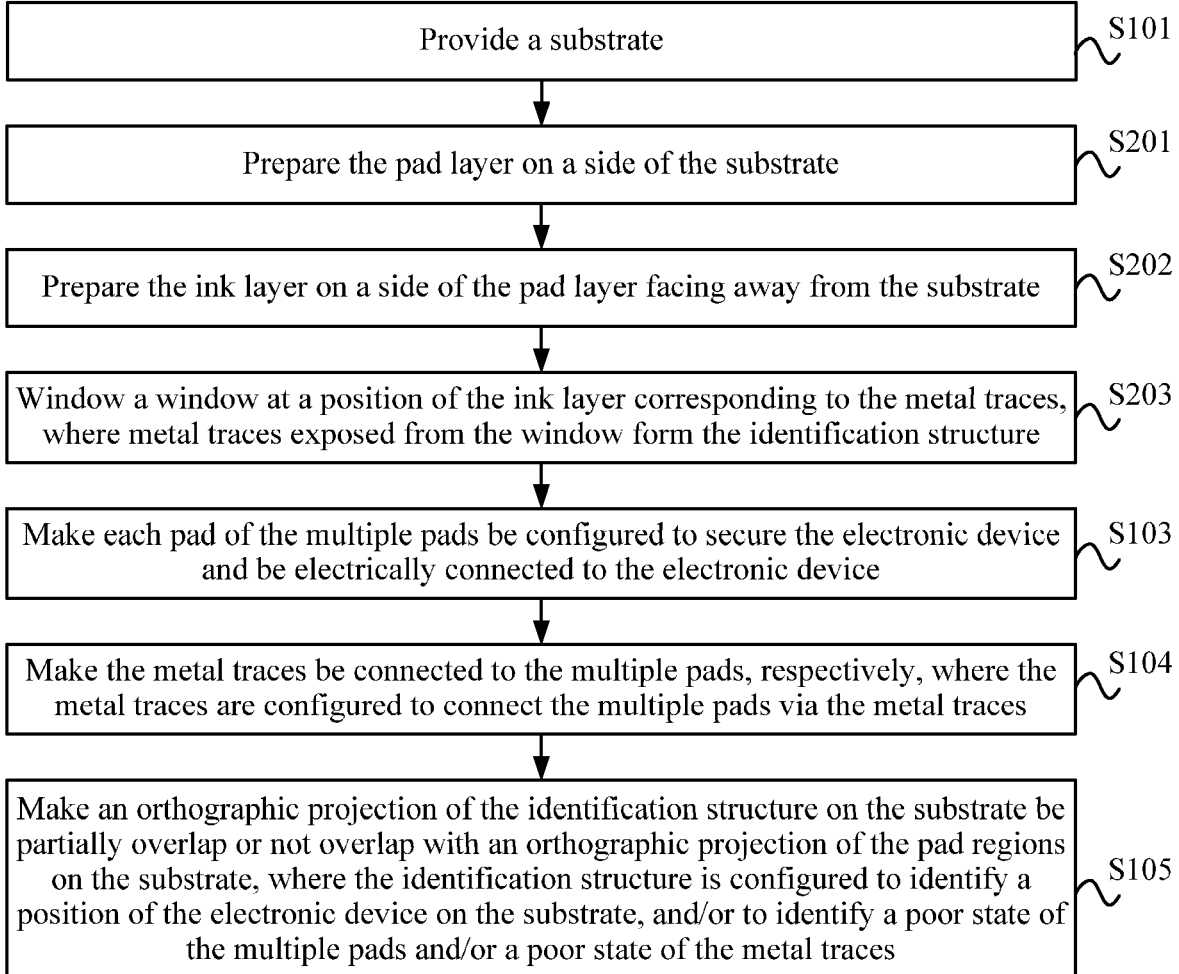

| Provide a substrate | S101 |

| Prepare the pad layer on a side of the substrate | S201 |

| Prepare the ink layer on a side of the pad layer facing away from the substrate | S202 |

| Window a window at a position of the ink layer corresponding to the metal traces, where metal traces exposed from the window form the identification structure | S203 |

| Make each pad of the multiple pads be configured to secure the electronic device and be electrically connected to the electronic device | S103 |

| Make the metal traces be connected to the multiple pads, respectively, where the metal traces are configured to connect the multiple pads via the metal traces | S104 |

| Make an orthographic projection of the identification structure on the substrate be partially overlap or not overlap with an orthographic projection of the pad regions on the substrate, where the identification structure is configured to identify a position of the electronic device on the substrate, and/or to identify a poor state of the multiple pads and/or a poor state of the metal traces | S105 |

FIG. 6

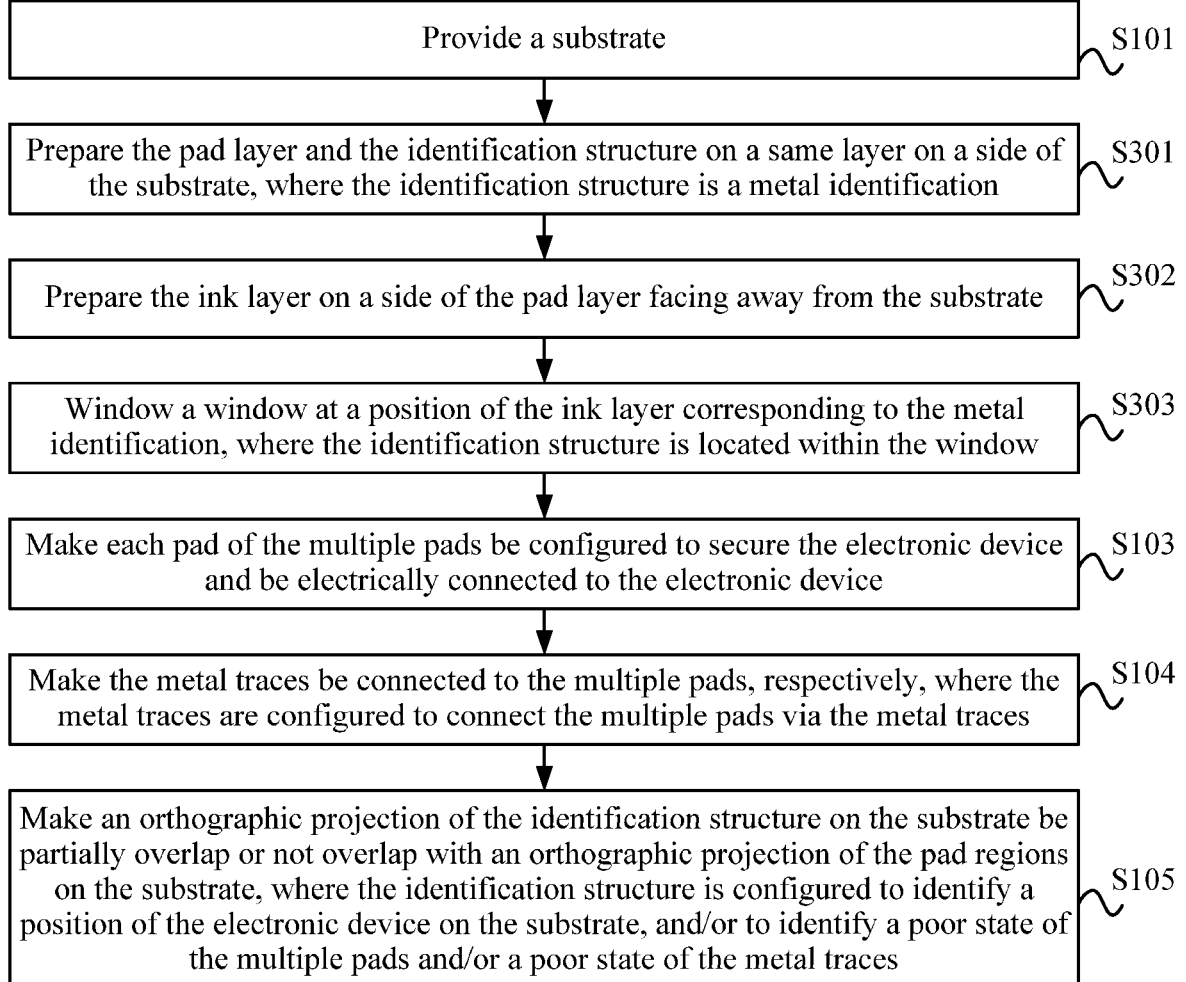

| Provide a substrate | S101 |

| Prepare the pad layer and the identification structure on a same layer on a side of the substrate, where the identification structure is a metal identification | S301 |

| Prepare the ink layer on a side of the pad layer facing away from the substrate | S302 |

| Window a window at a position of the ink layer corresponding to the metal identification, where the identification structure is located within the window | S303 |

| Make each pad of the multiple pads be configured to secure the electronic device and be electrically connected to the electronic device | S103 |

| Make the metal traces be connected to the multiple pads, respectively, where the metal traces are configured to connect the multiple pads via the metal traces | S104 |

| Make an orthographic projection of the identification structure on the substrate be partially overlap or not overlap with an orthographic projection of the pad regions on the substrate, where the identification structure is configured to identify a position of the electronic device on the substrate, and/or to identify a poor state of the multiple pads and/or a poor state of the metal traces | S105 |

FIG. 7

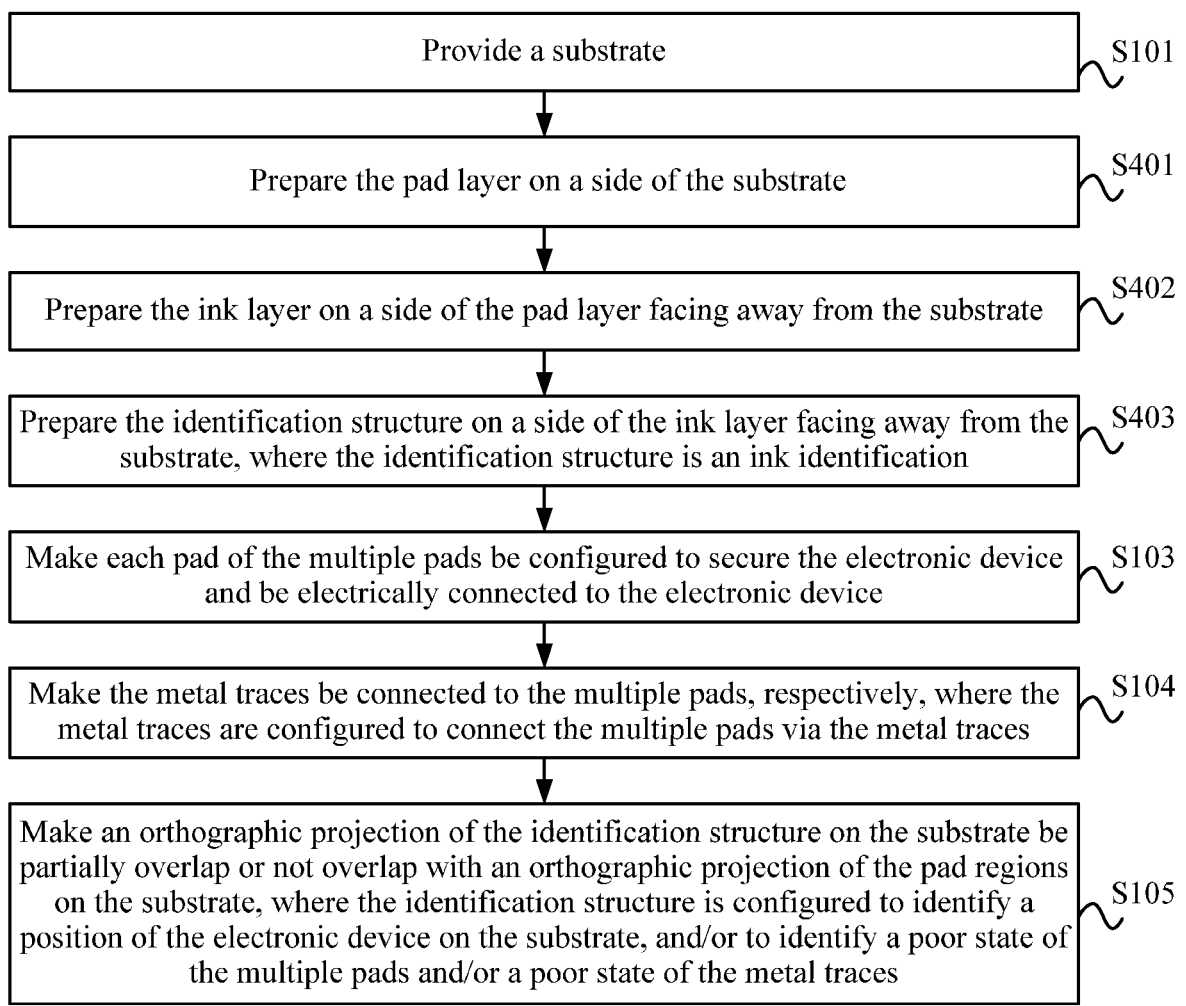

| Provide a substrate | S101 |

| Prepare the pad layer on a side of the substrate | S401 |

| Prepare the ink layer on a side of the pad layer facing away from the substrate | S402 |

| Prepare the identification structure on a side of the ink layer facing away from the substrate, where the identification structure is an ink identification | S403 |

| Make each pad of the multiple pads be configured to secure the electronic device and be electrically connected to the electronic device | S103 |

| Make the metal traces be connected to the multiple pads, respectively, where the metal traces are configured to connect the multiple pads via the metal traces | S104 |

| Make an orthographic projection of the identification structure on the substrate be partially overlap or not overlap with an orthographic projection of the pad regions on the substrate, where the identification structure is configured to identify a position of the electronic device on the substrate, and/or to identify a poor state of the multiple pads and/or a poor state of the metal traces | S105 |

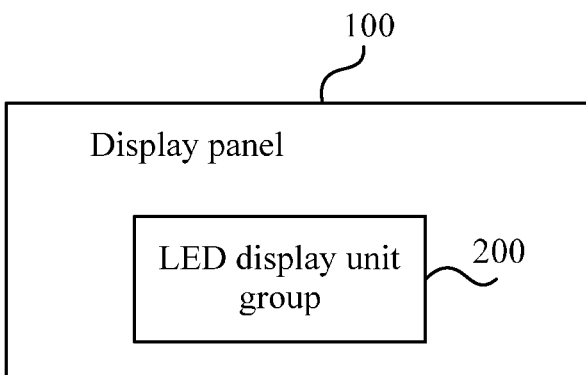

Display panel

LED display unit group          200

FIG. 9

LED DISPLAY UNIT GROUP, MANUFACTURING METHOD OF LED DISPLAY UNIT GROUP, AND DISPLAY PANEL

CROSS-REFERENCE TO RELATED APPLICATION(S)

This application claims priority to Chinese Patent Application No. 202210772462.X filed Jun. 30, 2022, the disclosure of which is incorporated herein by reference in its entirety.

TECHNICAL FIELD

The present disclosure relates to the field of LED display technologies, and in particular to, a LED display unit group, a manufacturing method of a LED display unit group, and a display panel.

BACKGROUND

With the development of display technology, LED displays are now attracting more and more attention, and the LED displays range from outdoors to indoors, and range from commercial and professional displays to consumer retail. Therefore, a distance between display points of the LED is required to be smaller and smaller, the reliability of a product is required to be higher and higher, and a traditional LED has low alignment precision along with the smaller and smaller distance between the display points, so that an alarm rate of a machine table during die bonding is increased, and thus the production efficiency and the yield of the product are affected.

In an existing LED display unit group, a problem of low production efficiency and low yield of the product is an urgent problem to be solved in the industry.

SUMMARY

The present disclosure provides a LED display unit group, a manufacturing method of a LED display unit group, and a display panel, to solve a problem of low production efficiency and low product yield existing in the LED display unit group.

According to a first aspect of the present disclosure, a LED display unit group is provided. The LED display unit group includes a substrate and an electronic device. The substrate includes a pad layer and an ink layer, the substrate is provided with an identification structure, the pad layer is disposed on a first surface of a side of the substrate adjacent to the electronic device, the pad layer includes pad regions and a non-pad region, each of the pad regions includes multiple pads, and the non-pad region includes metal traces, and the ink layer is disposed on a side of the pad layer facing away from the substrate. Each pad of the multiple pads is configured to secure the electronic device and is electrically connected to the electronic device. The metal traces are connected to the multiple pads, respectively, and the metal traces are configured to connect the multiple pads via the metal traces. An orthographic projection of the identification structure on the substrate is partially overlapped or not overlapped with an orthographic projection of the pad regions on the substrate, the identification structure is configured to identify a position of the electronic device on the substrate, and/or to identify a poor state of the multiple pads and/or a poor state of the metal traces.

Optionally, the identification structure is located on a side of the metal traces facing away from the substrate, and/or the identification structure is disposed on a same layer as the metal traces.

Optionally, a shape of the identification structure includes at least one of a triangle, a circle, an ellipse, or a rectangle.

Optionally, at least two of the pad regions are provided with a corresponding one identification structure; and the at least two of the pad regions form a first region, and the identification structure is disposed at an intermediate position or an edge position of the first region.

Optionally, the pad layer is symmetrical with respect to a symmetry axis in left-right directions, where the symmetry axis is a central axis of the substrate in a preset direction.

According to a second aspect of the present disclosure, a manufacturing method of a LED display unit group is provided. The method includes that: a substrate is provided; and a pad layer and an ink layer are prepared on a side of the substrate, and an identification structure is formed on the side of the substrate.

The pad layer is disposed on a first surface of a side of the substrate adjacent to an electronic device, the pad layer includes pad regions and a non-pad region, each of the pad regions includes multiple pads, and the non-pad region includes metal traces; and the ink layer is disposed on a side of the pad layer facing away from the substrate. Each pad of the multiple pads is configured to secure the electronic device and is electrically connected to the electronic device. The metal traces are connected to the multiple pads respectively, and the metal traces are configured to connect the multiple pads via the metal traces. An orthographic projection of the identification structure on the substrate is partially overlapped or not overlapped with an orthographic projection of the pad regions on the substrate, the identification structure is configured to identify a position of the electronic device on the substrate, and/or to identify a poor state of the multiple pads and/or a poor state of the metal traces.

According to a third aspect of the present disclosure, a display panel is provided. The display panel includes the LED display unit group provided in any of the items of the first aspect.

According to technical schemes of embodiments of the present disclosure, the orthographic projection of the identification structure on the LED display unit group is disposed to be partially overlapped or not overlapped with an orthographic projection of the pad regions on the LED display unit group, the identification structure is configured to identify a position of the electronic device on the LED display unit group and/or to identify a poor state of the pad regions and/or a poor state of the metal traces, so that the alignment precision of die bonding and the uniformity of soldering tin brushing on the pad regions are improved, the efficiency of the die bonding is improved, an alarm rate of a machine table during the die bonding is reduced, and the yield of the die bonding is improved.

BRIEF DESCRIPTION OF DRAWINGS

In order to more clearly explain technical schemes in embodiments of the present disclosure, the drawings used for describing the embodiments will be briefly introduced below. Obviously, the drawings in the following description are some embodiments of the present disclosure. For those of ordinary skill in the art, other drawings may also be obtained without creative labor according to these drawings.

FIG. 5 is a flowchart of a manufacturing method of a LED display unit group provided in an embodiment of the present disclosure;

FIG. 6 is a flowchart of another manufacturing method of a LED display unit group provided in an embodiment of the present disclosure;

FIG. 7 is a flowchart of still another manufacturing method of a LED display unit group provided in an embodiment of the present disclosure;

FIG. 8 is a flowchart of still another manufacturing method of a LED display unit group provided in an embodiment of the present disclosure; and FIG. 9 is a schematic structural diagram of a display panel provided in an embodiment of the present disclosure.

DETAILED DESCRIPTION

Figure 1:
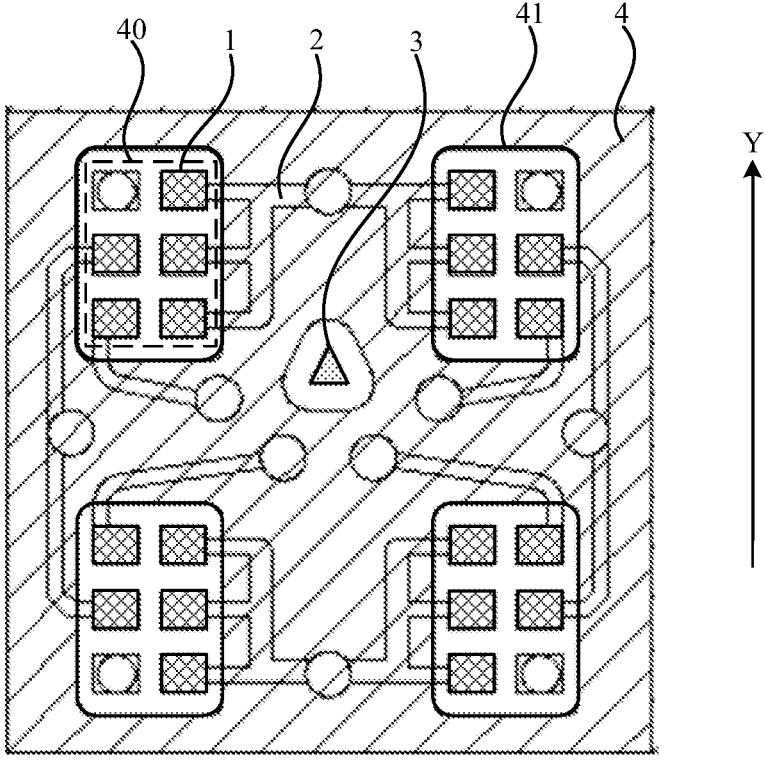
FIG. 1 is a schematic structural diagram of a substrate of a LED display unit group provided in an embodiment of the present disclosure.

In order to better understand schemes of the present disclosure by those skilled in the art, the technical schemes in the embodiments of the present disclosure will be described clearly and completely below in conjunction with the drawings in the embodiments of the present disclosure. Apparently, the described embodiments are merely part of the embodiments of the present disclosure, rather than all of the embodiments of the present disclosure. All other embodiments obtained by those of ordinary skill in the art based on the embodiments of the present disclosure without requiring creative efforts shall all fall within the scope of protection of the present disclosure.

It should be noted that the terms "first", "second", etc., in the specification and claims of the present disclosure and in the drawings described above are used for distinguishing similar objects, rather than describing a particular order or sequence. It should be understood that the data so used is interchangeable under appropriate circumstances so that the embodiments of the present disclosure described herein are capable of implementing in other sequences than those illustrated or described herein. Furthermore, the terms "include" and "have", as well as any variations thereof, are intended to cover a non-exclusive inclusion. For example, a process, a method, a system, a product, or an apparatus that includes a series of steps or units is not limited to those steps or units clearly listed, but optionally further includes steps or units not clearly listed, or optionally further includes other steps or units inherent to such process, method, product, or apparatus.

Figure 2:
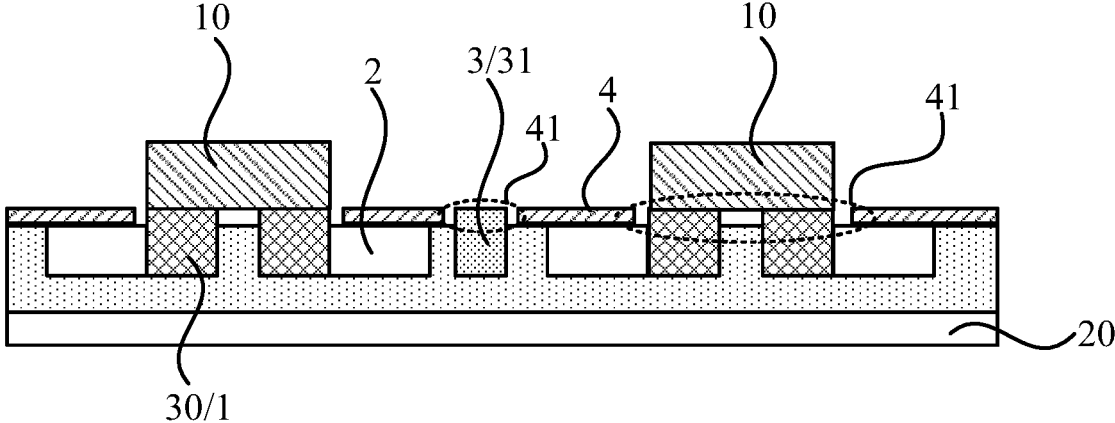
FIG. 2 is a schematic structural diagram of another LED display unit group provided in an embodiment of the present disclosure.

FIG. 1 is a schematic structural diagram of a substrate of a LED display unit group provided in an embodiment of the present disclosure. FIG. 2 is a schematic structural diagram of another LED display unit group provided in an embodiment of the present disclosure. With reference to FIGS. 1 and 2, the LED display unit group provided in the embodiments of the present disclosure includes a substrate 20 and an electronic device 10. The substrate 20 includes a pad layer 30 and an ink layer 4, the substrate 20 is provided with an identification structure 3, the pad layer 30 is disposed on a first surface of a side of the substrate 20 adjacent to the electronic device 10, the pad layer 30 includes pad regions 40 and a non-pad region, each of the pad regions 40 includes multiple pads 1, and the non-pad region include metal traces 2, and the ink layer 4 is disposed on a side of the pad layer 30 facing away from the substrate 20; the pad 1 is configured to secure the electronic device 10 and is electrically connected to the electronic device 10; the metal traces 2 are connected to the multiple pads 1, respectively, and the metal traces 2 are configured to connect the multiple pad 1 via the metal traces 2; and an orthographic projection of the identification structure 3 on the substrate 20 is partially overlapped or not overlapped with an orthographic projection of the pad regions 40 on the substrate 20, and the identification structure is configured to identify a position of the electronic device 10 on the substrate 20, and/or to identify a poor state of the multiple pads 1 and/or a poor state of the metal traces 2.

Specifically, the substrate 20 may include a single layer or multiple layers, and the pads 1 located in the pad regions 40 are used for mounting the electronic device 10, the electronic device 10 may include a LED chip, a LED device, a patch resistor or a switch tube, a drive IC, and the like. The metal traces 2 are connected to the multiple pads 1, respectively, and the metal traces 2 are configured to connect the multiple pads 1 via the metal traces 2 to form a circuit, which enables functions of the circuit.

The orthographic projection of the identification structure 3 on the substrate 20 is disposed to not overlap with the orthographic projection of the pad 1 on the substrate 20, so that the electronic device 10 is prevented from obscuring the identification structure 3 in a process of aligning and fixing the electronic device 10 to the pad 1. The identification structure 3 is used for identifying the position of the electronic device 10 on the substrate 20, so that a die bonding apparatus uses the identification structure 3 as the alignment standard, the alignment precision of die bonding and the uniformity of soldering tin brushing on the pad 1 are improved, the efficiency of the die bonding is improved, and an alarm rate of a machine table during the die bonding is reduced. The orthographic projection of the identification structure 3 on the substrate 20 does not overlap with the metal traces 2, without any limitation herein.

The orthographic projection of the identification structure 3 on the substrate 20 is partially overlapped with the orthographic projection of the metal traces 2 on the substrate 20. Through such an arrangement, space occupied by the identification structure 3 may be saved, and in addition, part of the metal traces 2 may be shared as the identification structure 3, or metal traces 2 with an easily recognizable shape may be used as the identification structure 3, whereby the preparation process and the material cost are saved.

The marking or removal on the identification structure 3 may be done by a laser when either the pad 1 or the metal trace 2 has poor hazards or when both the pad 1 and the metal traces 2 have poor hazards. During the die bonding, the pad 1 corresponding to the identification structure 3 identified with the poor state of the pad 1 and/or the metal traces 2 may be skipped according to the identification structure 3, so that the electronic device 10 being fixed on the pad 1 and/or metal traces 2 in the poor state is avoided, the electronic device 10 is saved, the electronic device 10, such as a LED chip, being fixed to the pad 1 in the poor state is avoided, and thus the yield of the die bonding is improved.

According to the LED display unit group provided in this embodiment, the orthographic projection of the identification structure on the substrate is disposed to partially overlap or not overlap with the orthographic projection of the pad on the substrate, the position of the electronic device on the substrate is disposed to be identified by the identification structure, and/or poor states of the pad and/or metal traces are disposed to be identified by the identification structure, so that the alignment precision of the die bonding and the uniformity of soldering tin brushing on the pad 1 are improved, the efficiency of the die bonding is improved, and the alarm rate of the machine table during the die bonding is reduced, and thus the yield of the die bonding is improved.

Optionally, on the basis of the above embodiments, with continuing reference to FIGS. 1 and 2, the identification structure 3 is a metal identification 31, the identification structure 3 is located on a side of the metal traces 2 facing away from the substrate 20, and/or the identification structure 3 is disposed on a same layer as the metal traces 2.

Specifically, a material of the identification structure 3 may be the same as a material of the pad 1, for example, the material is a metal such as copper. The identification structure 3 may be located on the side of the metal traces 2 facing away from the substrate 20, and the identification structure 3 may more clearly identify the position of the electronic device 10, and/or the identification structure 3 is disposed on the same layer as the metal traces 2, which may save the process and reduce a thickness of the substrate 20.

Optionally, on the basis of the above embodiments, with continuing reference to FIGS. 1 and 2, the ink layer 4 of the LED display unit group provided in the embodiments of the present disclosure includes a window 41 within which the identification structure 3 is located.

Specifically, the ink layer 4 is provided with a window 41 at the identification structure 3, so that an upper surface of the identification structure 3 is not provided with the ink layer 4, which facilitates identification of the identification structure 3 by the machine table, further improves the alignment precision and the efficiency of the die bonding. It should be noted that the pad 1 is configured to be electrically connected to the electronic device 10, and therefore the pad 1 is also disposed within the window 41, and the pad 1 and the identification structure 3 may be disposed within different windows 41.

Figure 3:
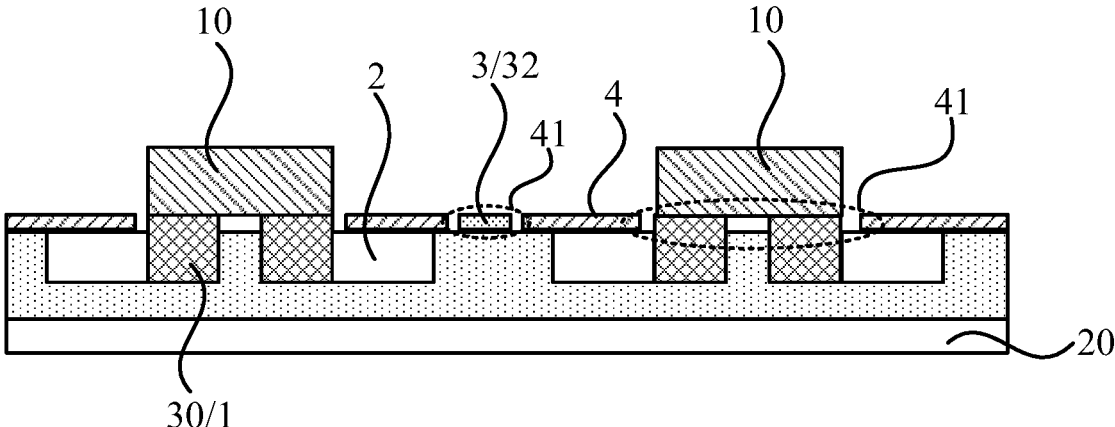
FIG. 3 is a schematic structural diagram of still another LED display unit group provided in an embodiment of the present disclosure.

Optionally, FIG. 3 is a schematic structural diagram of still another LED display unit group provided in an embodiment of the present disclosure. On the basis of the above embodiments, with continued reference to FIG. 3, the identification structure 3 may be an ink identification 32, and the ink identification 32 is disposed on a surface of a side of the ink layer 4 facing away from the substrate 20.

Specifically, a material of the ink identification 32 may be different from a material of the ink layer 4, for example, the material of the ink identification 32 may include white ink, the production of the identification structure 3 is facilitated by directly printing or spraying the ink identification 32 as the identification structure 3. The ink identification 32 is used for identifying a position of the electronic device 10 on the LED display unit group, so that the die bonding apparatus uses the ink identification 32 as the alignment standard, the alignment precision of the die bonding and the uniformity of soldering tin brushing on the pad 1 are improved, the efficiency of the die bonding is improved, and the alarm rate of the machine table during the die bonding is reduced. The ink identification 32 also facilitates marking on the ink identification 32 by a laser, so that the pad 1 corresponding to the ink identification 32 identified with a poor state of the pad 1 and/or the metal traces 2 may be skipped during the die bonding, the electronic device 10 being fixed on the pad 1 and/or metal traces 2 in the poor state is avoided, and thus the yield of the die bonding is improved.

Optionally, on the basis of the above embodiments, with continued reference to FIG. 1, a shape of the identification structure 3 includes at least one of a triangle, a circle, an oval or a rectangle.

Specifically, since the substrate 20 includes metal traces 2 and a pad 1, the metal traces 2 are generally of a bar-shaped structure, and the pad 1 is generally a rectangular pad. The shape of the identification structure 3 is set to include one or several of a triangle, a circle, an oval, a rectangle, a diamond, a pentagon or a pentagon and the like. The distinguish of the identification structure 3 from the pad 1 and the metal traces 2 on the substrate 20 is facilitated, the recognition degree of the identification structure 3 is improved, the alignment precision of the machine table is further improved, the efficiency of the die bonding is improved, an alarm rate of a machine table during the die bonding is reduced, and the yield of the die bonding is further improved.

It should be noted that FIG. 1 exemplarily shows a case where the shape of the identification structure 3 includes the triangle, and the shape of the identification structure 3 may be set as required, without any limitation herein.

Figure 4:
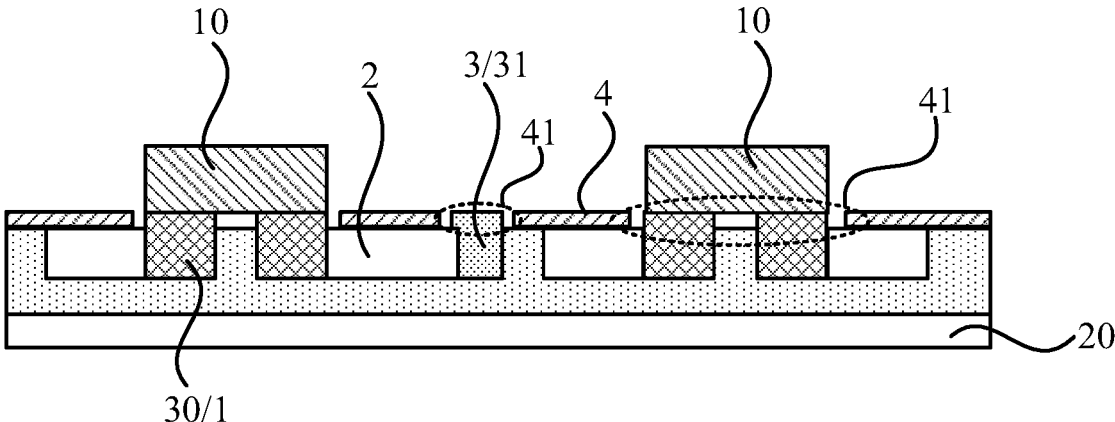
FIG. 4 is a schematic structural diagram of still another LED display unit group provided in an embodiment of the present disclosure.

In an optional application scenario, FIG. 4 is a schematic structural diagram of still another LED display unit group provided in an embodiment of the present disclosure. On the basis of the above embodiments, with continued reference to FIG. 4, when the identification structure 3 is a metal identification 31, the orthographic projection of the identification structure 3 on the substrate 20 may at least partially overlap with the orthographic projection of the metal traces 2 on the substrate 20.

Specifically, through such an arrangement, part of metal traces 2 may be shared as the identification structure 3, or metal traces 2 with an easily recognizable shape may be used as the identification structure 3, whereby the preparation process and the material cost are saved. When the identification structure 3 is disposed on a same layer as the metal traces 2, the orthographic projection of the identification structure 3 on the substrate 20 is partially overlapped with the metal traces 2, the metal traces 2 and the identification structure 3 may be integrally prepared, so that the process is saved.

Optionally, on the basis of the above embodiments, with continued reference to FIG. 1, at least two of the pad regions 40 are provided with a corresponding one identification structure 3; the at least two of the pad regions 40 form a first region, and the identification structure 3 is disposed in an intermediate position or an edge position of the first region.

Specifically, the at least two of the pad regions 40 are provided with a corresponding one identification structure 3, a number of identification structures 3 may be saved, multiple pad regions 40 in a same machine table window may be disposed to share one identification structure 3, for example, every four pad regions 40 share one identification structure 3, or every two pad regions 40 share one identification structure 3, it may be set as required, without any limitation herein.

The at least two of the pad regions 40 are disposed to form the first region, and the identification structure 3 is disposed at the intermediate position or the edge position of the first region, so that the identification structure 3 may be properly arranged without increasing an area of the substrate 20 and without increasing the volume.

It should be noted that FIG. 1 exemplarily shows a case where the identification structure 3 is disposed at the intermediate position of the first region, and the identification structure 3 may be disposed at the edge position of the first region as required, without any limitation herein.

Optionally, on the basis of the above embodiments, referring to FIG. 1, the pad layer 30 is symmetrical with respect to a symmetry axis in left-right directions, where the symmetry axis is a central axis of the substrate 20 in a preset direction Y.

Specifically, through such an arrangement, the preparation of the pad layer 30 is facilitated, and a number of identification structures 3 is saved.

FIG. 5 is a flowchart of a manufacturing method of a LED display unit group provided in an embodiment of the present disclosure. Referring to FIG. 5, the manufacturing method of the LED display unit group provided in the embodiment of the present disclosure includes described below.

In S101, a substrate is provided.

In S102, a pad layer and an ink layer are prepared on a side of the substrate, and an identification structure is formed on the side of the substrate, where the pad layer is disposed on a first surface of a side of the substrate adjacent to an electronic device, the pad layer includes pad regions and a non-pad region, each of the pad regions includes multiple pads, and the non-pad region includes metal traces; and the ink layer is disposed on a side of the pad layer facing away from the substrate.

In S103, each pad of the multiple pads is made be configured to secure the electronic device, and is made to be electrically connected to the electronic device.

In S104, the metal traces are connected to the multiple pads, respectively, where the metal traces are configured to connect the multiple pads via the metal traces.

In S105, an orthographic projection of the identification structure on the substrate is made to be partially overlapped or not overlapped with an orthographic projection of the pad regions on the substrate, where the identification structure is configured to identify a position of the electronic device on the substrate, and/or to identify a poor state of the multiple pads and/or a poor state of the metal traces.

Optionally, FIG. 6 is a flowchart of another manufacturing method of a LED display unit group provided in an embodiment of the present disclosure. On the basis of the above embodiments, referring to FIG. 6, the manufacturing method of the LED display unit group provided in the embodiment of the present disclosure includes described below.

In S101, a substrate is provided.

In S201, the pad layer is prepared on a side of the substrate.

In S202, the ink layer is prepared on a side of the pad layer facing away from the substrate.

In S203, a window is windowed at a position of the ink layer corresponding to the metal traces, where metal traces exposed from the window form the identification structure.

In S103, each pad of the multiple pads is made to be configured to secure the electronic device and is made to be electrically connected to the electronic device.

In S104, the metal traces are connected to the multiple pads, respectively, where the metal traces are configured to connect the multiple pads via the metal traces.

In S105, an orthographic projection of the identification structure on the substrate is made to be partially overlapped or not overlapped with an orthographic projection of the pad regions on the substrate, where the identification structure is configured to identify a position of the electronic device on the substrate, and/or to identify a poor state of the multiple pads and/or a poor state of the metal traces.

Optionally, FIG. 7 is a flowchart of still another manufacturing method of a LED display unit group provided in an embodiment of the present disclosure. On the basis of the above embodiments, referring to FIG. 7, the manufacturing method of the LED display unit group provided in the embodiment of the present disclosure includes described below.

In S101, a substrate is provided.

In S301, the pad layer and the identification structure are prepared on a same layer on a side of the substrate, where the identification structure is a metal identification.

In S302, the ink layer is prepared on a side of the pad layer facing away from the substrate.

In S303, a window is windowed at a position of the ink layer corresponding to the metal identification, where the identification structure is located within the window.

In S103, each pad of the multiple pads is made to be configured to secure the electronic device and is made to be electrically connected to the electronic device.

In S104, the metal traces are connected to the multiple pads, respectively, where the metal traces are configured to connect the multiple pads via the metal traces.

In S105, an orthographic projection of the identification structure on the substrate is made to be partially overlapped or not overlapped with an orthographic projection of the pad regions on the substrate, where the identification structure is configured to identify a position of the electronic device on the substrate, and/or to identify a poor state of the multiple pads and/or a poor state of the metal traces.

Optionally, FIG. 8 is a flowchart of still another manufacturing method of a LED display unit group provided in an embodiment of the present disclosure. On the basis of the above embodiments, referring to FIG. 8, the manufacturing method of the LED display unit group provided in the embodiment of the present disclosure includes described below.

In S101, a substrate is provided.

In S401, the pad layer is prepared on a side of the substrate.

In S402, the ink layer is prepared on a side of the pad layer facing away from the substrate.

In S403, the identification structure is prepared on a side of the ink layer facing away from the substrate, where the identification structure is an ink identification.

In S103, each pad of the multiple pads is made to be configured to secure the electronic device and is made to be electrically connected to the electronic device.

In S104, the metal traces are connected to the multiple pads, respectively, where the metal traces are configured to connect the multiple pads via the metal traces.

In S105, an orthographic projection of the identification structure on the substrate is made to be partially overlapped or not overlapped with an orthographic projection of the pad regions on the substrate, where the identification structure is configured to identify a position of the electronic device on the substrate, and/or to identify a poor state of the multiple pads and/or a poor state of the metal traces.

FIG. 9 is a schematic structural diagram of a display panel provided in an embodiment of the present disclosure. On the basis of the above embodiments, referring to FIG. 9, the display panel 100 provided in the embodiment of the present disclosure includes the LED display unit group 200 provided in any of the above embodiments, and has the beneficial effects of the LED display unit group 200 provided in any of the above embodiments, which are not described herein again.

It should be understood that various forms of the flows, the reordering step, the adding step or the deleting step shown above may be used. For example, as long as the desired result of the technical scheme provided in the present disclosure may be achieved, the steps described in the present disclosure may be executed in parallel, sequentially or in different orders, which is not limited herein.

What is claimed is:

1. A LED display unit group, comprising a substrate and an electronic device; wherein, the substrate comprises a pad layer and an ink layer, the substrate is provided with an identification structure, the pad layer is disposed on a first surface of a side of the substrate adjacent to the electronic device, the pad layer comprises pad regions and a non-pad region, each of the pad regions comprises a plurality of pads, and the non-pad region comprises metal traces, and the ink layer is disposed on a side of the pad layer facing away from the substrate; the ink layer at least partially covers the metal traces, the ink layer is provided with a window, and part of the metal traces exposed from the window forms the identification structure;

each pad of the plurality of pads is configured to secure the electronic device and is electrically connected to the electronic device;

the metal traces are connected to the plurality of pads, respectively, and the metal traces are configured to connect the plurality of pads via the metal traces; and an orthographic projection of the identification structure on the substrate is partially overlapped or not overlapped with an orthographic projection of the pad regions on the substrate, the identification structure is configured to identify at least one of: a position of the electronic device on the substrate, a poor state of the plurality of pads, or a poor state of the metal traces.

2. The LED display unit group of claim 1, wherein a shape of the identification structure comprises at least one of a triangle, a circle, an ellipse, or a rectangle.

3. The LED display unit group of claim 1, wherein at least two of the pad regions are provided with a corresponding one identification structure; and the at least two of the pad regions form a first region, and the identification structure is disposed at an intermediate position or an edge position of the first region.

4. The LED display unit group of claim 1, wherein the pad layer is symmetrical with respect to a symmetry axis in left-right directions, wherein the symmetry axis is a central axis of the substrate in a preset direction.

5. A manufacturing method of a LED display unit group, comprising:

providing a substrate; and preparing a pad layer and an ink layer on a side of the substrate and forming an identification structure on the side of the substrate; wherein, the pad layer is disposed on a first surface of a side of the substrate adjacent to an electronic device, the pad layer comprises pad regions and a non-pad region, each of the pad regions comprises a plurality of pads, and the non-pad region comprises metal traces; and the ink layer is disposed on a side of the pad layer facing away from the substrate, and the ink layer at least partially covers the metal traces;

each pad of the plurality of pads is configured to secure the electronic device and is electrically connected to the electronic device;

the metal traces are connected to the plurality of pads respectively, and the metal traces are configured to connect the plurality of pads via the metal traces; and an orthographic projection of the identification structure on the substrate is partially overlapped or not overlapped with an orthographic projection of the pad regions on the substrate, the identification structure is configured to identify at least one of: a position of the electronic device on the substrate, a poor state of the plurality of pads, or a poor state of the metal traces;

wherein preparing the pad layer and the ink layer on the side of the substrate and forming the identification structure on the side of the substrate comprises:

preparing the pad layer on the side of the substrate;

preparing the ink layer on a side of the pad layer facing away from the substrate; and windowing a window at a position of the ink layer corresponding to the metal traces, wherein part of the metal traces exposed from the window form the identification structure.

6. A display panel, comprising a LED display unit group; wherein the LED display unit group comprises a substrate and an electronic device; wherein, the substrate comprises a pad layer and an ink layer, the substrate is provided with an identification structure, the pad layer is disposed on a first surface of a side of the substrate adjacent to the electronic device, the pad layer comprises pad regions and a non-pad region, each of the pad regions comprises a plurality of pads, and the non-pad region comprises metal traces, and the ink layer is disposed on a side of the pad layer facing away from the substrate; the ink layer at least partially covers the metal traces the ink layer is provided with a window and part of the metal traces exposed from the window forms the identification structure;

each pad of the plurality of pads is configured to secure the electronic device and is electrically connected to the electronic device;

the metal traces are connected to the plurality of pads, respectively, and the metal traces are configured to connect the plurality of pads via the metal traces; and an orthographic projection of the identification structure on the substrate is partially overlapped or not overlapped with an orthographic projection of the pad regions on the substrate, the identification structure is configured to identify at least one of: a position of the electronic device on the substrate, a poor state of the plurality of pads, or a poor state of the metal traces.

7. The display panel of claim 6, wherein a shape of the identification structure comprises at least one of a triangle, a circle, an ellipse, or a rectangle.

8. The display panel of claim 6, wherein at least two of the pad regions are provided with a corresponding one identification structure; and the at least two of the pad regions form a first region, and the identification structure is disposed at an intermediate position or an edge position of the first region.

9. The display panel of claim 6, wherein the pad layer is symmetrical with respect to a symmetry axis in left-right directions, wherein the symmetry axis is a central axis of the substrate in a preset direction.

* * * * *